US008213636B2

(12) United States Patent
De Muynke et al.

(10) Patent No.: US 8,213,636 B2
(45) Date of Patent: Jul. 3, 2012

(54) METHOD AND A SYSTEM FOR RECONSTITUTING LOW FREQUENCIES IN AUDIO SIGNAL

(75) Inventors: Julien De Muynke, Paris (FR); Benoit Pochon, Paris (FR); Guillaume Pinto, Paris (FR)

(73) Assignee: Parrot, Paris (FR)

( * ) Notice: Subject to any disclaimer, the term of this patent is extended or adjusted under 35 U.S.C. 154(b) by 500 days.

(21) Appl. No.: 12/432,250

(22) Filed: Apr. 29, 2009

(65) Prior Publication Data

US 2009/0323983 A1 Dec. 31, 2009

(30) Foreign Application Priority Data

Apr. 29, 2008 (FR) ...................................... 08 02388

(51) Int. Cl.
*H03G 5/00* (2006.01)

(52) U.S. Cl. ............... 381/98; 381/17; 381/61; 381/106

(58) Field of Classification Search .................... 381/61, 381/96, 98, 1, 17, 106
See application file for complete search history.

(56) References Cited

U.S. PATENT DOCUMENTS

| | | | | |
|---|---|---|---|---|
| 5,930,373 | A * | 7/1999 | Shashoua et al. | 381/98 |
| 6,111,960 | A * | 8/2000 | Aarts et al. | 381/61 |
| 2003/0223588 | A1 | 12/2003 | Trammell et al. | |
| 2005/0041815 | A1* | 2/2005 | Trammell et al. | 381/1 |
| 2007/0140511 | A1* | 6/2007 | Lin et al. | 381/98 |
| 2007/0299655 | A1 | 12/2007 | Laaksonen et al. | |
| 2008/0170721 | A1* | 7/2008 | Sun et al. | 381/98 |

FOREIGN PATENT DOCUMENTS

| | | | |
|---|---|---|---|
| EP | 1947903 | A1 | 7/2008 |
| WO | 9742789 | A1 | 11/1997 |

OTHER PUBLICATIONS

Laroche, Jean,"Synthesis of Sinusoids via Non-Overlapping Inverse Fourier Transform", IEEE Transactions on Speech and Audio Processing, vol. 8 No. 4, Jul. 2000, p. 471-477.

* cited by examiner

*Primary Examiner* — Minh-Loan T Tran
*Assistant Examiner* — Fazli Erdem
(74) *Attorney, Agent, or Firm* — Haverstock & Owens LLP

(57) ABSTRACT

The method comprises the steps of: filtering the audio signal by means of a lowpass filter (101) with a cutoff frequency substantially equal to said cutoff frequency ($F_0$) of the sound playback device; determining a fundamental frequency for reconstituting from the lowpass filtered audio signal; and generating a harmonic signal ($S_{harm}$) associated with said fundamental frequency to be reconstituted. It also comprises the steps of: detecting a time envelope (env(t)) of the lowpass filtered audio signal; adapting the dynamic range of said time envelope (env(t)) as a function of the frequency band under consideration; and reinjecting said harmonic signal in phase into said audio signal by addition after multiplying said harmonic signal ($S_{harm}$) with the adapted time envelope ($env_{adapt}$(t)). The adaptation is performed by compression/expansion of the time envelope with feedback loop control that is adjusted automatically on the value of the envelope as a function of the mean energy of the input signal to a value that maximizes said energy within a defined limit.

9 Claims, 4 Drawing Sheets

METHOD AND A SYSTEM FOR RECONSTITUTING LOW FREQUENCIES IN AUDIO SIGNAL

The invention relates to a method and to a system for reconstituting low frequencies of an audio signal, suitable for use at the output from a sound playback device presenting a cutoff frequency for low frequencies.

A particularly advantageous application of the invention lies in the field of electro-acoustic equipment, in particular stereo loudspeakers for reproducing musical works or indeed speakers of personal computers (PCs) for reproducing the sound tracks of video files.

Any loudspeaker has a cutoff frequency for low frequencies, below which it is no longer capable of radiating energy. The cutoff frequency is directly associated with the dimensions of the loudspeaker, and more precisely with the size of its diaphragm. The smaller the loudspeaker, the higher its cutoff frequency in the spectrum. Thus, a loudspeaker of small dimensions naturally imposes attenuation on the low frequency content of a piece of music, to the detriment of the listener who can no longer benefit from this information and thus senses a disagreeable effect associated with the loss of deep sounds.

A first solution to the above difficulty consists in applying a filter to amplify the low frequencies attenuated by the loudspeaker, thereby mechanically forcing the diaphragm of the loudspeaker to radiate at such low frequencies. Nevertheless, that solution presents a real risk for the integrity of the loudspeaker. The excursion of the diaphragm, i.e. the amplitude of its movement relative to its equilibrium position, can become too great and the diaphragm can be damaged or even torn.

Another solution relies on a psycho-acoustic property of the human ear that enables low frequencies to be perceived even if they are not actually transmitted by a device forming part of a sound reproduction system, e.g. a loudspeaker. This residual pitch perception effect is generally known as the "missing fundamental effect" and results from the fact that the pitch of a sound signal is associated not only with the presence of the fundamental frequency in the signal, but also with the presence of higher harmonics of that frequency. In other words, if the fundamental frequency, e.g. at 100 hertz (Hz), is eliminated from a signal while nevertheless conserving its higher harmonics at 200 Hz, 300 Hz, 400 Hz, . . . , then the pitch as perceived will remain the same since it is the frequency difference, here 100 Hz, between the higher frequencies that determines the pitch as perceived and gives the hearer the impression of hearing a signal with a pitch of 100 Hz. Naturally, this truncating of the signal, whereby it lacks its fundamental frequency, gives rise to a tone color that is different, since tone color is determined specifically by the relative amplitudes of the set of harmonics.

It is thus possible to remedy the total or partial attenuation of fundamental frequencies of audio signals below the cutoff frequency by acting in real time to generate a harmonic signal that is synthesized from the harmonics associated with each of the attenuated fundamental frequencies, and by reinjecting the harmonic signal into the original audio signal. It will be understood that even if the fundamental frequency of the sound is attenuated or even completely absorbed, the higher harmonics, which are situated above the cutoff frequency of the sound playback device, can continue to be transmitted, thereby reconstituting the pitch of the sound by the above-explained missing-fundamental effect.

This method of enabling the spectrum of the passband of an electro-acoustic system to be extended downwards in virtual manner is known as "virtual base generation".

In this context, U.S. Pat. No. 5,930,373 A1 describes one such method, consisting in generating harmonics relating to the low frequencies of the audio signal by means of a modulator system. The reference signal is multiplied by itself to obtain a double frequency signal, and is then multiplied again by itself to obtain a triple frequency signal, etc. That known system has the advantage of being fast since it does not include any significant delay, and has the advantage of not requiring any frequency information. Nevertheless, it presents the drawback of being non-linear If the original audio signal contains a sum of frequencies, then not only will the harmonics of each of those frequencies be generated, but also the harmonics derived from intermodulation terms that run the risk of severely degrading the audio performance of the system.

U.S. Pat. No. 6,134,330 A1 discloses a method in which the signal containing low frequencies passes through a series of non-linear filters each constituted by a rectifier and an integrator. That processing gives rise to a series of higher harmonics associated with each fundamental frequency. Nevertheless, like the previously-described method, that method also presents the drawbacks of a non-linear system, i.e. it generates intermodulation artifacts that can affect the resulting signal.

Yet another technique is described in WO 97/42789 A1, which provides for filtering the audio signal by means of a lowpass filter having its cutoff frequency substantially equal to the cutoff frequency of the sound playback device, and then in determining the fundamental frequencies to be reconstituted by detecting the zero crossings of the filtered audio signal. The fundamental frequencies that are to be reconstituted at the output are determined by detecting zero crossings and the values of their higher harmonics are deduced therefrom very simply for the purpose of synthesizing the harmonic signals associated with each fundamental frequency and for use in implementing the above-described pitch re-establishment effect. Nevertheless, the presence of the lowpass filter leads to non-uniform amounts of phase shifting, producing negative interference on the signal obtained at the output, since the harmonic signal is no longer reinjected in phase into the original audio signal. This produces harmonic levels that are unequal depending on frequency, since they are potentially lower for frequencies that are not in phase with frequencies of the original signal.

Another problem lies in the fact that the synthesized signal presents time variations that do not faithfully track the variations in the original signal, thereby having the effect of spoiling the nuances thereof.

On this topic, US 2003/223588 A1 proposes a base reinforcing device in which the envelope of the synthesized signal is adjusted by a compression/expansion system in which the slope and an offset are adjustable. The slope and the offset are adjusted simultaneously so that the mean energy of the envelope is compensated, the simultaneous control being settable by a potentiometer or any other manual adjustment device.

That system presents the drawback of not being adapted to all types of input signal, particularly if the intended purpose is to obtain as natural as possible a rendering of tone color, rather than producing acoustic effects by generating frequency components that are not contained in the original signal, as applies to US 2003/223588 A1, which seeks essentially to enlarge artificially the stereo field by increasing the "brightness" of the sound or indeed by introducing distortion that is reminiscent of the sound specific to vacuum tube amplifiers.

If the teaching of that document is applied to reconstituting the pitch of the sound by the above-explained missing fundamental effect, a base line at moderate level would be amplified to the same level as a very loud base line, an effect that would be perceived negatively by the user.

Another problem, common to all of the techniques described in the above-mentioned document, stems from the fact that those techniques do not take account of variations in the hearing perception of human beings as a function of frequency (known as the loudness perception effect). Depending on sound level and frequency, the same variation in a sound signal will not produce the same perceived variation in intensity. For example, to go from a perceived intensity variation of 40 phones to one of 50 phones, it is necessary for the sound signal to be increased by nearly 10 dB at 100 Hz, whereas no more than an additional 5 dB or 6 dB is required at 50 Hz.

Thus, an object of the invention is to provide a method of reconstituting low frequencies of an audio signal output by a sound playback device, which method complies with the time variations of the original signal so as to preserve the nuances thereof, and also takes account of the way human hearing perception varies with frequency.

The method of the invention is of the same type as that disclosed in above-mentioned WO 97/42789 A1, i.e. a method of reconstituting low frequencies of an audio signal output by a sound playback device having a low cutoff frequency ($F_0$), and comprising the steps of:

- filtering the audio signal by means of a lowpass filter with a cutoff frequency substantially equal to said cutoff frequency of the sound playback device;
- determining a fundamental frequency to be reconstituted from the lowpass filtered audio signal; and
- generating a harmonic signal associated with said fundamental frequency to be reconstituted.

In accordance with the invention, the above-mentioned objects are achieved by the fact that the method further comprises the steps of:

- detecting a time envelope of the lowpass filtered audio signal;
- adapting the dynamic range of said time envelope as a function of the frequency band under consideration; and
- reinjecting said harmonic signal in phase into said audio signal by addition, after multiplying said harmonic signal with the adapted time envelope.

Adapting the dynamic range of the time envelope as a function of the frequency band makes it possible, in particular, to take account of variations in the way human hearing perception varies with frequency, and detecting the time envelope and taking it into account by multiplication with the generated harmonic signal makes it possible to modulate the synthesized signal with the time variations of the envelope.

In practice, the step of adapting the time envelope is performed by compression/expansion of the time envelope.

It has been found in particular that it is preferable to amplify the gain of the envelope when the base line is weak or moderate, so that the effect proposed is always perceived positively by the user.

Thus, contrary to the compression/expansion method proposed by above-mentioned US 2003/223588 A1, that provides for setting an otherwise constant offset by manual adjustment, the invention proposes dynamically automating the adjustment of the offset of the envelope by means of a feedback loop acting on the value of the envelope (advantageously with time constants that are different for adjusting up and down). Thus, the offset is adjusted automatically as a function of the mean energy of the input signal to a value that maximizes this energy within a defined limit.

According to various advantageous subsidiary characteristics:

- the compression/step is controlled conditionally after comparing the level of the compressed/expanded signal with a predetermined threshold;
- this control includes dynamically modifying at least one parameter of the compression/expansion characteristic as a function of the level of the compressed/expanded signal;
- this dynamic modification is performed iteratively in successive steps, with the size of the modification step applied to said parameter for strong signals above a given threshold concerning the compressed/expanded signal being greater than the step size for modifying the same parameter for low levels, below a given threshold of the compressed/expanded signal;
- the parameter in question is the position of the invariant point of the compression/expansion characteristic;
- the compression/expansion characteristic is a linear characteristic for inputs and outputs expressed on a logarithmic scale;
- the slope of the compression/expansion characteristic is kept constant while modifying the parameter; and
- the position of the invariant point of the compression/expansion characteristic is modified by modifying the intercept of said linear characteristic, said modification preferably being limited by maximum and minimum values.

The invention also provides a module for reconstituting low frequencies of an audio signal for implementing the above-described method, the module comprising:

- a lowpass filter suitable for filtering said audio signal with a cutoff frequency substantially equal to the cutoff frequency of sound playback device; and
- a first branch for processing the lowpass filtered audio signal in order to generate a harmonic signal associated with at least one fundamental frequency to be reconstituted in the audio signal, said first branch including a block suitable for determining said fundamental frequency.

According to the invention, the module further comprises:

- a second branch for processing the lowpass filtered audio signal, the second branch comprising a detector for detecting the time envelope of said signal and an adaptation circuit for adapting said time envelope as a function of its instantaneous level; and
- a circuit suitable for reinjecting said harmonic signal in phase into said audio signal by addition, after multiplication of said harmonic signal by the adapted time envelope.

Most advantageously, the dynamic adaptation circuit comprises a time envelope compressor/expander involved in a feedback loop that enables the general level of the time envelope to be controlled dynamically so as to raise said level for weak signals and attenuated for strong signals.

There follows a description of an embodiment of the device of the invention given with reference to the accompanying drawings in which the same numerical references are used from one figure to another to designate elements that are identical or functionally similar.

Figure 5:
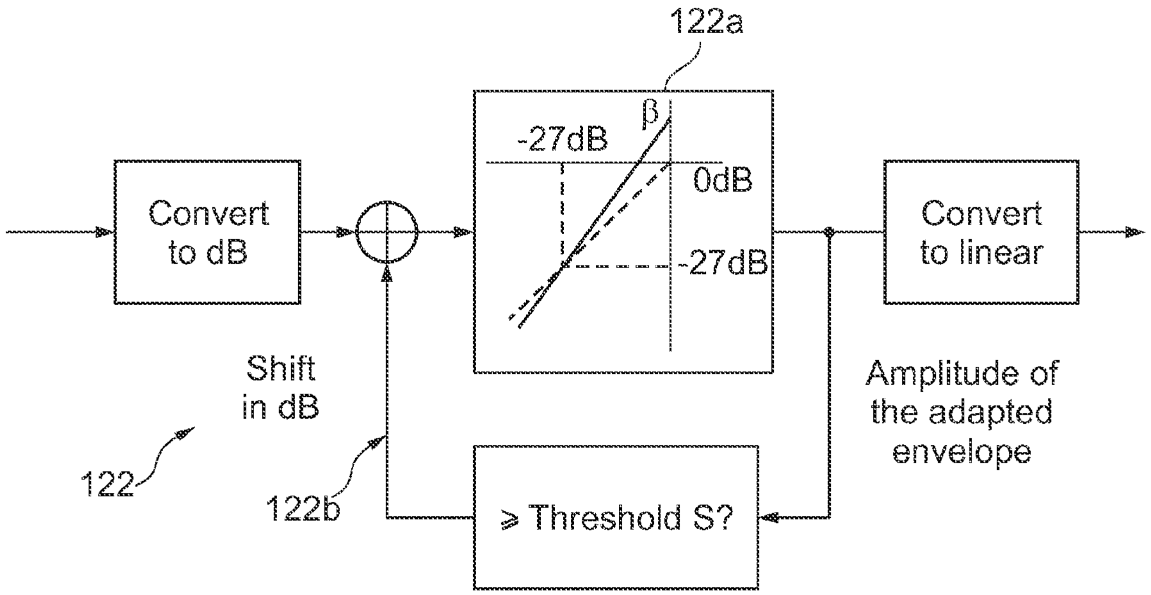
FIG. 5 is a diagram of the compressor/expander of the envelope adapter circuit of the FIG. 3 module.
Figures 8A, 8B:
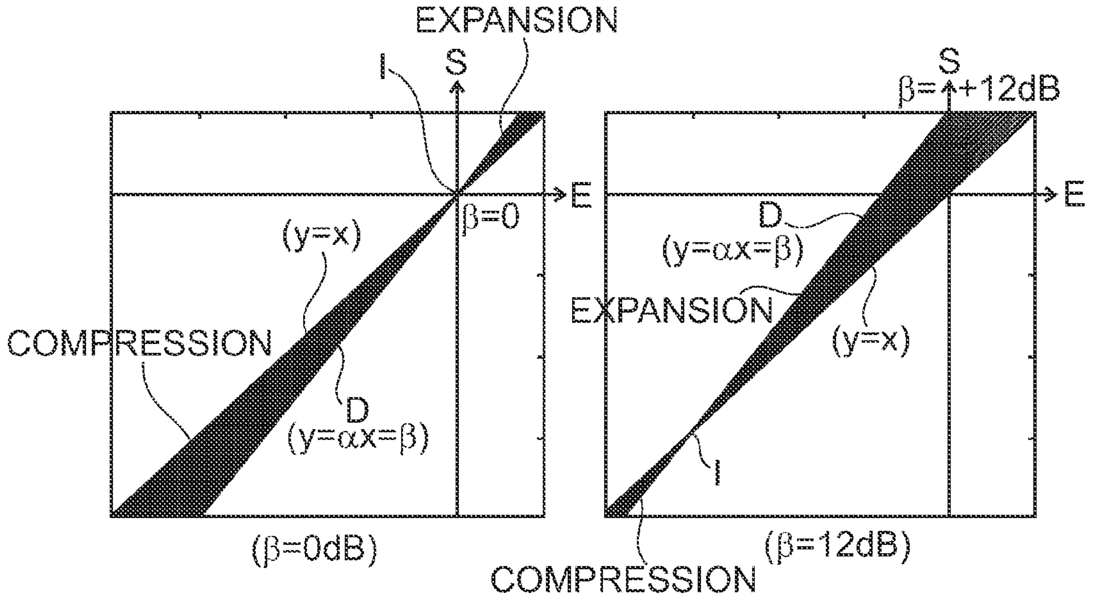

FIGS. 8*a* and 8*b* are diagrams of the response of the FIG. 5 compressor/expander, respectively in a minimum gain configuration and a maximum gain configuration, showing how the characteristic is modified as a function of the gain level applied by the compressor/expander.

The following description with reference to the accompanying drawings, given by way of non-limiting example, shows clearly what the invention consists in and how it can be reduced to practice.

General Principle Implemented

Figure 1:
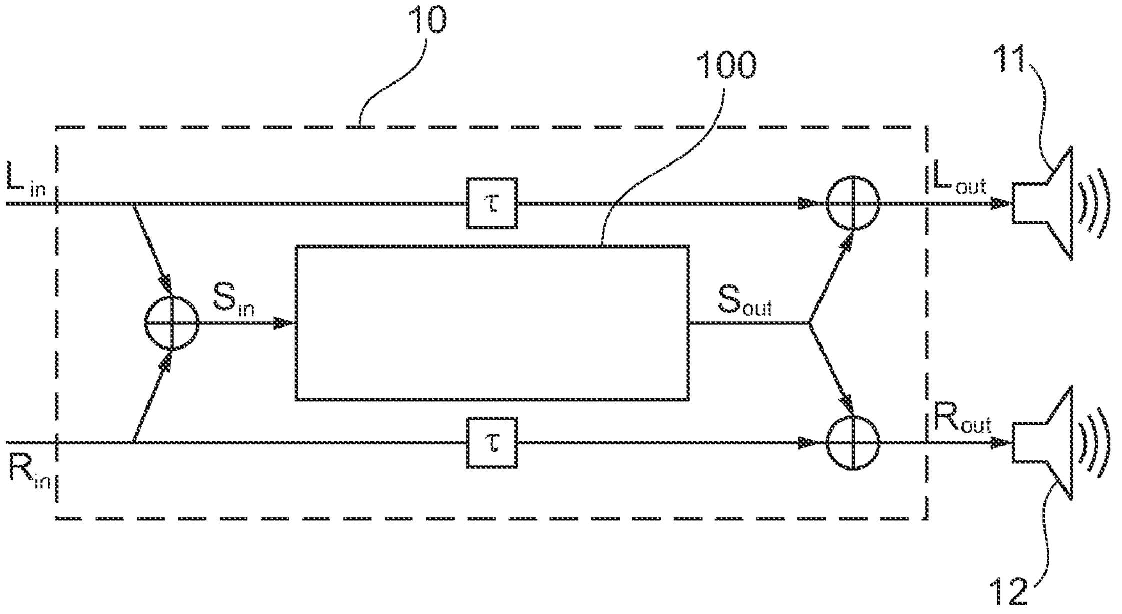
FIG. 1 is a diagram of the general architecture of a system of the invention for reconstituting low frequencies.

FIG. 1 shows an architecture for a system 10 for reconstituting low frequencies in an audio signal, e.g. a stereo signal, said low frequencies needing to be reconstituted at the output from a sound playback device constituted by two loudspeakers 11 and 12 associated with each stereo output signal $L_{out}$ and $R_{out}$, said loudspeakers presenting a low frequency cutoff at a frequency $F_0$ of 120 Hz, for example.

The reconstitution system of FIG. 1 comprises a reconstitution module 100 also referred to as a "virtual base" generator module, operating on the above-explained principle of pitch re-establishment that consists, in substance, in processing an input signal $S_{in}$ that results from the mean of the input stereo signals $L_{in}$ and $R_{in}$ so as to generate an output harmonic signal $S_{out}$ that is associated with at least one fundamental frequency below the cutoff frequency $F_0$ and that it is desired to reconstitute at the output from the loudspeakers 11 and 12 by the pitch re-establishment effect. The output harmonic signal $S_{out}$ as generated in this way is reinjected in phase at the output from the virtual base generator module 100 into the original stereo signals $L_{in}$ and $R_{in}$ in order to form the stereo output signals $L_{out}$ and $R_{out}$.

In the description below, said output harmonic signal $S_{out}$ is generated by summing three sinusoidal components of frequencies respectively equal to the first three harmonics of the low frequency signal that is to be reconstituted, i.e. the fundamental frequency, or first harmonic, and the next two higher harmonics, i.e. the harmonics at twice and three times the fundamental frequency. Naturally, other choices could be made, for example use could be made of the first four harmonics, the essential point under all circumstances being that the generated harmonic signal contains at least two consecutive harmonics so as to make the difference between them perceptible, which is equal to the "pitch".

Figure 2:
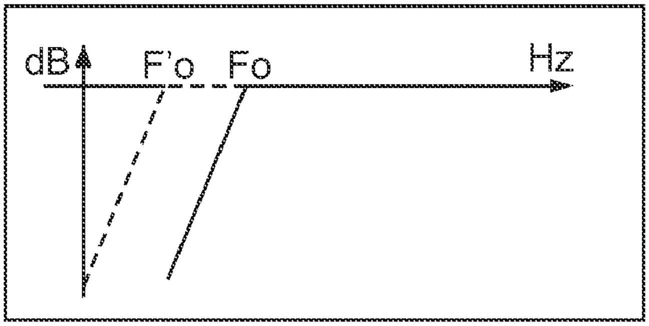
FIG. 2 shows the extension to the passband achieved by the FIG. 1 system.

Consequently, in the configuration described herein, if the cutoff frequency $F_0$ is 120 Hz, the low frequency range that can benefit from reconstitution by the pitch effect extends from 60 Hz to 120 Hz. For a fundamental frequency for reconstitution of 60 Hz, the harmonics under consideration are at 60 Hz, 120 Hz, and 180 Hz. The passband of the system 100 is thus "virtually" extended downwards to a new cutoff frequency $F'_0$ equal to 60 Hz, as shown in FIG. 2. The frequency range occupying the interval $[F'_0, F_0]$ is referred to as the fundamental frequency range (FFR).

Reconstituting Low Frequencies

The reconstitution module 100 is described below in detail with reference to FIG. 3.

At its input, the module 100 has a first lowpass filter 101 with a cutoff frequency that is substantially equal to the cutoff frequency $F_0$. This filter 101 serves to perform a first extraction of the FFR from amongst all of the frequencies contained in the input signal $S_{in}$, and to limit the phenomenon of aliasing distortion. The signal $S_{in}$ as filtered in this way is then sub-sampled by a factor of 10 in a block 102 in order to reduce the complexity of the filtering while conserving sufficient resolution for the forthcoming estimation of the fundamental frequencies to be reconstituted.

The signal $S_{in}$ as lowpass filtered and sub-sampled in this way is subsequently processed in parallel in two branches 110 and 120 of the module 100.

The purpose of the first branch 110 is to generate a harmonic signal $S_{harm}$ that results from synthesizing three sinusoidal components at respective frequencies equal to a fundamental frequency contained in the FFR and its next two higher harmonics.

The second branch 120 serves to construct a time envelope $env_{adapt}(t)$ for modulating the harmonic signal $S_{harm}$ So that the output signal $S_{out}$ reproduces the time variations in the original signal. The output signal $S_{out}$ thus results, in particular, from multiplying the harmonic signal $S_{harm}$ by the envelope $env_{adapt}(t)$ in a multiplier circuit 103:

$$S_{out}=S_{harm}env_{adapt}(t)$$

Figure 3:
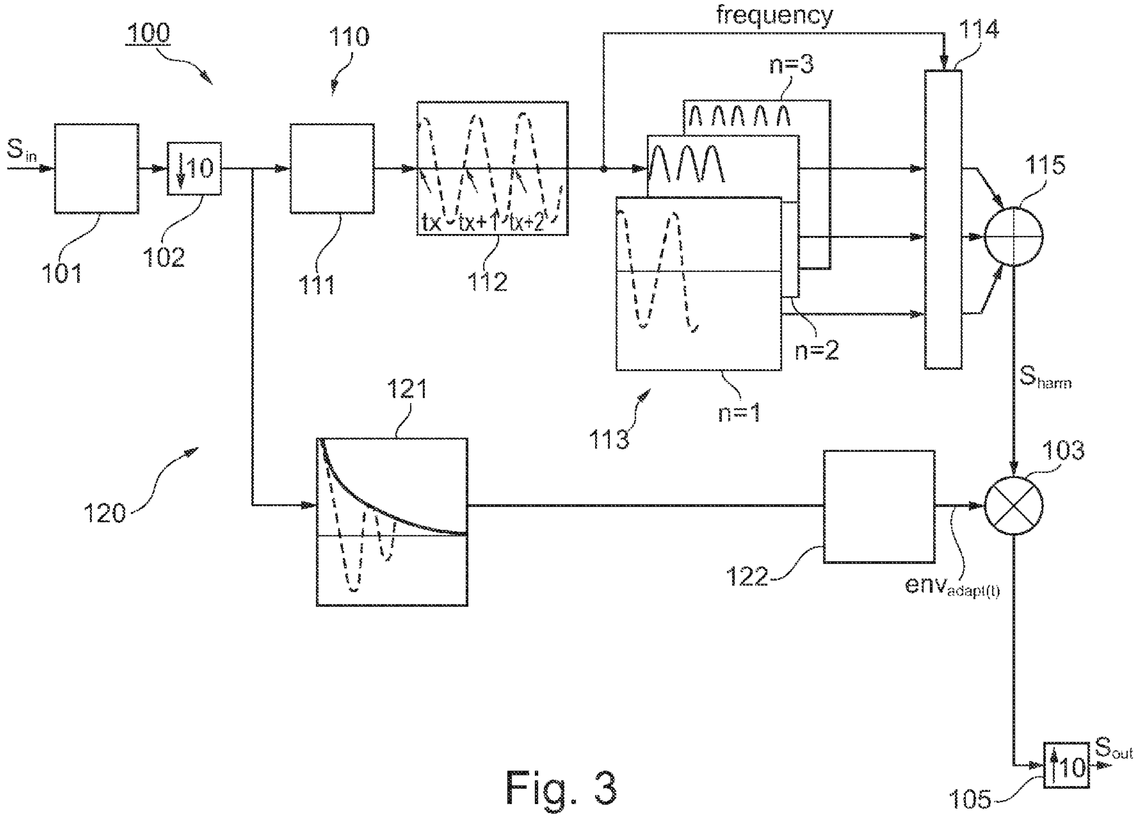
FIG. 3 is a detail diagram of the low frequency reconstitution module of the FIG. 1 system.

As shown in FIG. 3, the first processing branch 110 includes a second lowpass filter 111 for defining the FFR again and for eliminating from the original signal any frequencies lying outside the FFR.

Advantageously, the filter 111 incorporates an all-pass stage serving to linearize the phase of the signal by canceling the variable phase shift effect introduced by the lowpass filtering. The phase effect introduced by such linearization is corrected by a delay T introduced (see FIG. 1) in the original signal $L_{in}$ or $R_{in}$ before it is combined with the output harmonic signal $S_{out}$ synthesized by the module 100 and reinjected in phase with the original signal in order to form the output signals $L_{out}$ and $R_{out}$.

The fundamental frequencies contained in the FFR that it is desired to reconstitute by the pitch re-establishment effect are determined by means of a block 112 for identifying zero crossings of the signal from the second lowpass filter 111. More precisely, the block 112 determines the durations of the fundamental periods between two zero crossings, and deduces therefrom the corresponding fundamental frequencies.

For each fundamental frequency determined by the block 112, a harmonic generator 113 then delivers three sinusoidal components at the fundamental frequency itself (n=1), together with the next two higher harmonics (n=2, n=3). These three sinusoidal components are constructed from a common table, referred to as a "wavetable", that is stored in memory, and that gives the values for one sinewave period. For greater detail concerning this technique, reference can be made to the article by J. Laroche entitled *Synthesis of sinusoids via non-overlapping inverse Fourier transform*, IEEE Transactions on Speech and Audio Processing, IEEE Service Center, New York, N.Y., USA, Vol. 8, No. 4, July 2000, pp. 471-477.

In practice, on the basis of the fundamental period, the generator 113 constructs the sinusoidal components from sample to sample by advancing through the table by steps of regular size. Depending on the detected period, the generator 113 calculates a certain step size for constructing the component at the fundamental frequency (n=1), and, starting from the first sample, it increases this step index so as to determine the following sample. The sampling step size is selected so as to be compatible with the computation power of the microprocessor of the system 10, it being understood that the method implemented by the invention is a real-time method and consequently that it must not introduce any delay between the signals. By way of example, the wavetable may have 4096 points for one complete period.

The next two higher harmonics (n=2, n=3) are generated in the same manner using step sizes that are respectively twice and three times the step size corresponding to the fundamental frequency.

In FIG. 3, it can be seen that the sinusoidal components delivered by the generator 113 are then subjected to a weighting operation performed by a circuit 114 in which each component is given an experimentally-determined "patch" adaptation coefficient, so as to give the output signal $S_{out}$ a tone color close to that of the original signal. The values of these coefficients depend essentially on the order of the harmonic under consideration, i.e. the first harmonic (n=1) or fundamental frequency, the second harmonic (n=2), and the third harmonic (n=3) (as described above the "tone color" of a sound signal is determined by the ratio of energies between its various frequency components).

More precisely, the circuit 114 receives frequency information from the block 112 and weights the harmonics, depending on instantaneous frequency, on the basis of tables of coefficients indexed by the detected frequency. Thus, for example, the weighting applied to the sinewaves at 60 Hz, 120 Hz, and 180 Hz will be different from that applied to the sinewaves at 100 Hz, 200 Hz, and 300 Hz.

The weighted sinusoidal components are summed at the output from the weighting circuit 114 by an adder circuit 115 to form the synthesized harmonic signal $S_{harm}$ containing the first three harmonics of the fundamental frequency under consideration for reconstituting.

Determining and Adapting the Time Envelope

Figure 4:
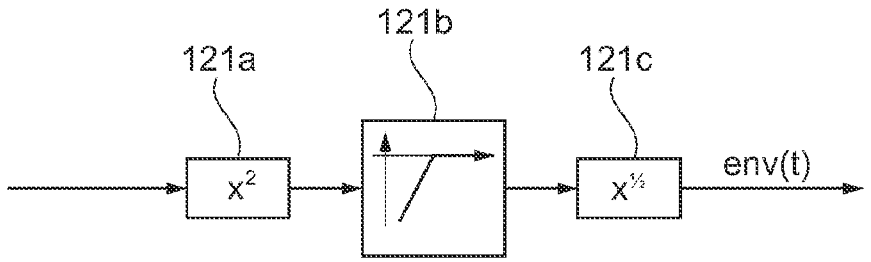
FIG. 4 is a block diagram of the time envelope detector of the FIG. 3 module.

In parallel with generating the harmonics in the first branch 110, the second branch 120 of the treatment extracts the time envelope env(t) of the lowpass filtered and sub-sampled signal from the block 102 by means of an envelope detector 121, as shown in FIG. 4, which operates in conventional manner by performing a root mean square (rms) calculation consisting in squaring the signal in a block 121*a*, filtering it through a lowpass filter 121*b*, and then taking the square root in a block 121*c*.

Furthermore, it should be observed that the synthesized harmonic signal $S_{harm}$ does not have the same spectral composition as the original low frequency signal, since it is made up not only of the fundamental frequency but also of the next two higher harmonics. The human ear does not perceive all frequencies with the same intensity, and time variations between two sound signals are not perceived in the same manner if they have different spectral contents. In order to take this constraint into account, the variations in the envelope env(t) need to be adapted as a function of the FFR.

Figure 6:
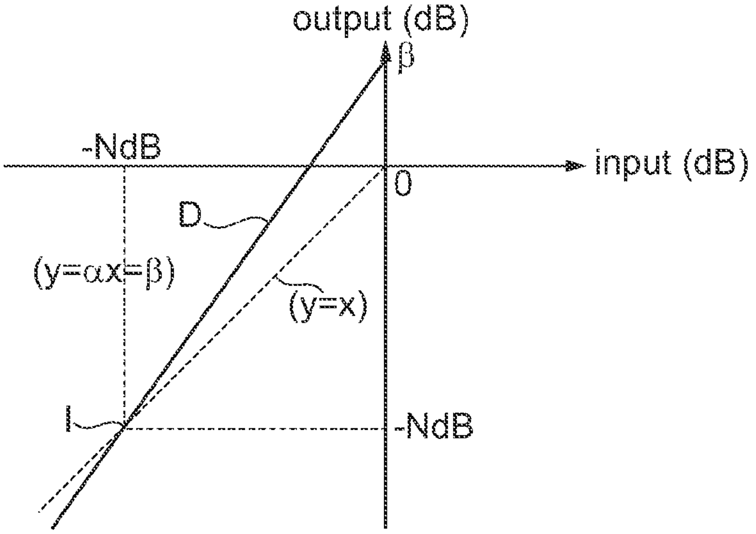
FIG. 6 is a diagram of the response of the compressor/expander of FIG. 5.

As shown in FIG. 3, this adaptation is performed on the second processing branch 120 by a circuit 122 suitable for performing a compression/expansion operation in application of the input/output response curve given in FIG. 6. For the envelope env(t) previously calculated in decibels, the lower levels of the envelope are attenuated, i.e. levels below a given threshold −N dB, −27 dB in the example shown whereas the higher levels are further increased, i.e. the levels greater than −N dB. This adaptation, based on a perception scale, enables the signal as generated in this way to be given time variations that are perceived as being similar to the time variations of the original signal, thus making it possible to guarantee that the generated tone color is faithful to the original.

As shown by the diagram of FIG. 5, the adaptation circuit 122 is controlled by a feedback loop 122*b* as follows.

To simplify implementation of the circuit, and without this having any significant incidence on the results obtained, it is possible to make the following two approximations in the frequency range under analysis (typically 40 Hz to 120 Hz):

- the expansion ratio, i.e. the factor by which a given variation x in the original signal, expressed in decibels, should be multiplied in order to obtain the same variation in intensity perceived in the harmonic signal, expressed in phones, is constant for a given harmonic; and
- the expansion ratio does not depend on the order of the harmonic under consideration (even though, in theory, it should increase with harmonic order).

The value chosen for the expansion ratio is a mean of the expansion ratios for all of the frequencies, amplitudes, and harmonic orders under consideration.

The compression/expansion process, shown diagrammatically at 122*a*, is applied to the detected envelope as determined by the envelope detector 121, and then this expanded envelope is used to modulate the synthesized harmonic sum (since the expansion ratio is the same for all of the harmonics).

The expansion ratio, written α below, corresponds to the slope of the straight line D shown in FIG. 6 (as explained above, on study of the isophone curves, it can be considered that this slope is constant). The intercept (ordinate at the origin) of this straight line D is written β, and is a function of the desired invariant point I, which in the example shown in FIG. 6 is situated at (−27 dB, −27 dB). The transfer function of the block 122*a* may be expressed in the following form:

$$\text{output(dB)} = \alpha \times \text{input(dB)} + \beta\text{(dB)}$$

If it is desired that the system always amplifies the sound level perceived for base tones (i.e. even when the level of the time envelope is less than −N dB (−27 dB in the example shown), and given that α is constant, it is appropriate to increase β by a certain amount so that the compression/expansion characteristic D lies above the line y=x of unit slope for this low level of the envelope. Conversely, if the low frequencies are at a high level in the original signal, then care must be taken to avoid amplifying the envelope excessively.

To achieve this result, the invention proposes using a system for adapting the level of the envelope, based on a feedback loop.

The principle of this loop, as shown in FIG. 5, consists in comparing the instantaneous level of the expanded envelope as delivered at the output from the compression/expansion module 122*a* with a threshold S. If this level is below the threshold, the parameter β is increased by a constant step size for adapting the following sample. Conversely, if the instantaneous level of the expanded envelope is greater than the threshold S, β is decreased by a constant step size.

The size of the increase or decrease step is not the same in both cases. If the instantaneous level of the expanded envelope suddenly becomes very large—e.g. when playing percussion—it is necessary for the reduction in β to act very quickly, in order to avoid reaching excessively high levels. In contrast, if the instantaneous level is low, β can be increased more progressively, particularly since it is appropriate to comply with the nuances of the original piece: natural attenuation of low notes must be complied with since, were β to increase as fast as it decreases, the notes would never end.

Figure 7:
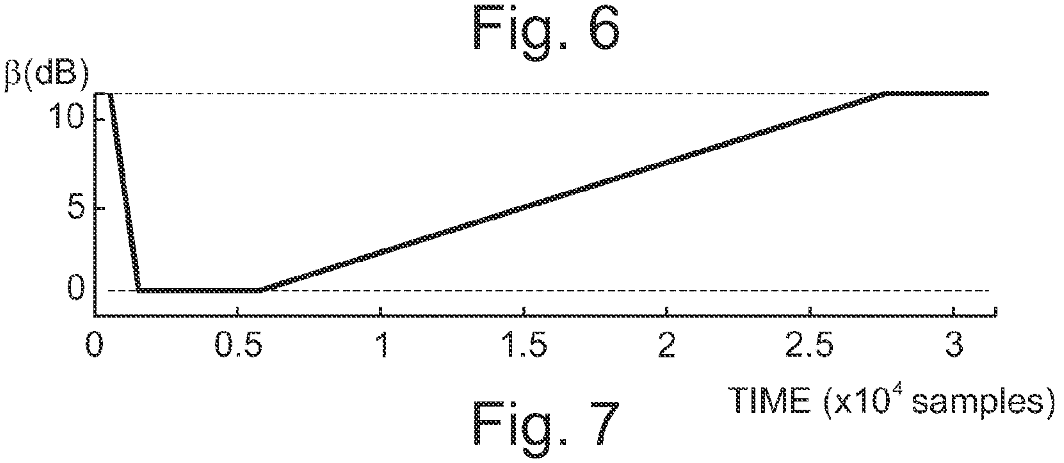
FIG. 7 shows the way in which the ordinate at the origin β of the FIG. 5 compressor/expander varies differently in the increasing and decreasing directions, and with minimum and maximum thresholds being applied.

FIG. 7 shows how the parameter β varies when increasing and when decreasing for a piece of music that presents a sudden change in level, followed by a rapid decrease of that level. It should also be observed that variation in the parameter β is limited by a minimum value (e.g. β=0) and a maximum value (e.g. β=+12 dB).

The principle whereby β is increased and decreased is as follows: a variable flag takes the value 0 or 1 as a function of the result of comparing the instantaneous level of the expanded envelope with the threshold S, and the adaptation step size for β is calculated in application of the following formula:

$$step\_size=coeff\times(x_0-flag),\ \text{for } 0<x_0<1$$

where $x_0$ is selected as a function of the ratio desired between the increase and decrease step sizes for β, and coeff is selected as a function of the desired rate of adaptation (if coeff is small, β varies slowly, whereas if coeff is large, it varies quickly).

Variations in β give rise to a shift in the invariant point I of the compression/expansion characteristic D.

FIGS. 8*a* and 8*b* show the characteristic D obtained for the two extreme values of β, respectively β=0 dB and β=+12 dB (while β is varying, the straight line D oscillates vertically between the two extreme positions shown in FIGS. 8*a* and 8*b*).

The zone of effective compression (i.e. the zone where the output signal is attenuated relative to the input signal) and the zone of effective expansion (i.e. the zone where the output signal is amplified relative to the input signal) are separated by the invariant point I, with the sectors lying between the characteristic D and the straight line of unit slope y=x defining the compression region (below point I) and the expansion region (above point I).

The feedback loop thus makes it possible to compress or expand the envelope as a function of its instantaneous level, so as to make more uniform the level of the low frequency components reinjected into the original signal, regardless of the musical genre of the piece under consideration (with the time constants of the servo-control being selected to be small enough to avoid affecting the natural decay of the notes). This makes it possible to generate harmonic signals of relatively constant amplitude regardless of the original signal. Thus, a low frequency sound signal of small dynamic range in low frequencies will nevertheless be significantly reinforced by the system, whereas a sound signal with a high-energy base line will be reinforced to a limited level so as to conserve a rendering that is natural.

This method of adapting the envelope, combining a compression/expansion module with a feedback control loop makes it possible to generate a signal that is perceived as being similar to the original signal when reproduced by a loudspeaker of larger dimensions.

Final Reconstitution of the Output Signal

Returning to FIG. 3, once the envelope has been adapted by the circuit 122, the harmonic signal $S_{harm}$ synthesized in the first branch 110 is modulated by the adapted envelope $env_{adapt}(t)$ from the second branch 120 by multiplication performed by means of the circuit 103, and then the signal is over-sampled by a factor of 10 in the block 105 so as to return to the initial sampling frequency. It can be advantageous at this stage to introduce a lowpass filter in the over-sampling process since such a filter presenting linear phase does not introduce phase distortion, where such distortion would go against the desired purpose of reinjecting the synthesized signal in phase with the original signal.

Since reinjecting the highpass filtered and over-sampled output signal $S_{out}$ runs the risk of exceeding the dynamic range, and output limiter is used for the reconstitution system 10 so that the signal sent to the loudspeakers 11 and 12 remains contained within a dynamic range of 16 bits.

The invention claimed is:

1. A method of reconstituting low frequencies of an audio signal output by a sound playback device (11, 12) having a low cutoff frequency ($F_0$), the method comprising the steps of:

filtering the audio signal by means of a lowpass filter (101) with a cutoff frequency substantially equal to said cutoff frequency ($F_0$) of the sound playback device;

determining a fundamental frequency to be reconstituted from the lowpass filtered audio signal; and generating a harmonic signal ($S_{harm}$) associated with said fundamental frequency to be reconstituted;

the method being characterized by the steps of:

detecting a time envelope (env(t)) of the lowpass filtered audio signal;

adapting the dynamic range of said time envelope (env(t)) as a function of the frequency band under consideration, wherein adapting is performed by compression/expansion (122*a*) of the time envelope (env(t)), further wherein a feedback loop (122*b*) conditionally controls the compression/expansion after comparing the level of the compressed/expanded signal with a predetermined threshold (S); and reinjecting said harmonic signal in phase into said audio signal by addition, after multiplying said harmonic signal ($S_{harm}$) with the adapted time envelope ($env_{adapt}(t)$).

2. The method of claim 1, wherein said feedback loop control of the compression/expansion step includes dynamically modifying at least one parameter of the compression/expansion characteristic (D) as a function of the level of the compressed/expanded signal.

3. The method of claim 2, wherein said dynamic modification of said parameter is modification performed iteratively, in successive steps.

4. The method of claim 3, wherein the modification step size of said parameter for high levels, greater than a given threshold, of the level of the compressed/expanded signal is greater than the step size for modifying the same parameter with low levels, less than a given threshold, of the compressed/expanded signal.

5. The method of claim 2, wherein said at least one parameter is the position of the invariant point (I) of the compression/expansion characteristic.

6. The method of claim 5, wherein said compression/expansion characteristic is a linear characteristic (D), for inputs/outputs expressed on a logarithmic scale.

7. The method of claim 6, wherein the slope (a) of said compression/expansion characteristic is kept constant when modifying said parameter.

8. The method of claim 6, wherein the position of said invariant point (I) is modified by modifying the intercept (β) of said linear characteristic.

9. The method of claim 8, wherein said modification of the intercept of the linear characteristic is a modification that is limited by minimum and maximum values.

* * * * *

UNITED STATES PATENT AND TRADEMARK OFFICE

CERTIFICATE OF CORRECTION

PATENT NO. : 8,213,636 B2
APPLICATION NO. : 12/432250
DATED : July 3, 2012
INVENTOR(S) : Julien De Muynke, Benoit Pochon and Guillaume Pinto It is certified that error appears in the above-identified patent and that said Letters Patent is hereby corrected as shown below:

Column 7, line 34, Claim 7, please replace Claim 7 with the following Claim:

The method of claim 6, wherein the slope ($\alpha$) of said compression/expansion characteristic is kept constant when modifying said parameter.

Signed and Sealed this
Thirtieth Day of April, 2013

Teresa Stanek Rea
*Acting Director of the United States Patent and Trademark Office*